(12) United States Patent
Shin et al.

(10) Patent No.: US 12,610,851 B2
(45) Date of Patent: Apr. 21, 2026

(54) SEMICONDUCTOR DEVICE AND METHOD OF MAKING A DUAL-SIDE MOLDED SYSTEM-IN-PACKAGE WITH FINE-PITCHED INTERCONNECTS

(71) Applicant: STATS ChipPAC Pte. Ltd., Singapore (SG)

(72) Inventors: YongMoo Shin, Incheon (KR); SeongKuk Kim, Gyeonggi-do (KR); SinJae Kim, Incheon (KR); SeokBeom Heo, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 428 days.

(21) Appl. No.: 18/315,964

(22) Filed: May 11, 2023

(65) Prior Publication Data

US 2024/0379480 A1    Nov. 14, 2024

(51) Int. Cl.
| | |
|---|---|
| *H01L 23/31* | (2006.01) |
| *H01L 21/48* | (2006.01) |
| *H01L 21/56* | (2006.01) |
| *H01L 21/60* | (2006.01) |
| *H01L 23/00* | (2006.01) |
| *H01L 23/552* | (2006.01) |

(52) U.S. Cl.
CPC ...... *H01L 23/3135* (2013.01); *H01L 21/4825* (2013.01); *H01L 21/565* (2013.01); *H01L 21/60* (2021.08); *H01L 23/552* (2013.01); *H01L 24/03* (2013.01); *H01L 24/05* (2013.01); *H01L 24/11* (2013.01); *H01L 24/13* (2013.01); *H01L 24/73* (2013.01); *H01L 24/94* (2013.01);

*H01L 2021/6024* (2013.01); *H01L 2224/05493* (2013.01); *H01L 2224/13026* (2013.01)

(58) Field of Classification Search
CPC ........... H01L 2924/3025; H01L 23/562; H01L 23/552; H01L 23/3135; H01L 21/565; H01L 21/56; H01L 2021/6027; H01L 23/3128; H01L 24/16; H01L 24/81; H01L 2021/6024; H01L 24/29; H01L 24/13
USPC ................................. 257/678; 438/106, 121
See application file for complete search history.

(56) References Cited

U.S. PATENT DOCUMENTS

| | | | |
|---|---|---|---|
| 8,535,553 | B2 | 9/2013 | Kong et al. |
| 10,421,123 | B2 | 9/2019 | Jeong et al. |
| 10,566,320 | B2 | 2/2020 | Shih et al. |
| 10,643,974 | B2 | 5/2020 | Chiu et al. |
| 11,152,331 | B2 | 10/2021 | Wang et al. |
| 2012/0182706 | A1* | 7/2012 | Siomkos ............... H01L 23/552 361/803 |
| 2020/0075503 | A1* | 3/2020 | Chuang ............... H01L 21/4817 |

(Continued)

FOREIGN PATENT DOCUMENTS

| | | |
|---|---|---|
| KR | 10-1465616 B1 | 11/2014 |
| KR | 10-1895114 B1 | 9/2018 |

*Primary Examiner* — Didarul A Mazumder
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate. An electrical component is disposed over a first surface of the substrate. A solder paste is disposed over the first surface of the substrate. A conductive pillar is disposed on the solder paste. An encapsulant is deposited over the first surface of the substrate, the electrical component, and the conductive pillar. A solder bump is formed over the conductive pillar.

23 Claims, 10 Drawing Sheets

(56) References Cited

U.S. PATENT DOCUMENTS

| 2020/0161267 A1* | 5/2020 | Jeng | ........................ H01L 21/56 |
| 2021/0084747 A1* | 3/2021 | Schrems | ................ H05K 1/145 |
| 2023/0260936 A1* | 8/2023 | Tsai | ........................ H01L 24/05 |
| | | | 257/737 |

* cited by examiner

SEMICONDUCTOR DEVICE AND METHOD OF MAKING A DUAL-SIDE MOLDED SYSTEM-IN-PACKAGE WITH FINE-PITCHED INTERCONNECTS

FIELD OF THE INVENTION

The present invention relates in general to semiconductor devices and, more particularly, to a semiconductor device and method of making a dual-side molded system-in-package with fine-pitched interconnects.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices may contain multiple electrical components, e.g., semiconductor die and discrete components, disposed on a substrate to perform necessary electrical functions. Such a package is commonly referred to as a system-in-package (SIP) module or dual-side molding system-in-package (DSmSiP). The substrate may have multiple layer interconnect structures to accommodate the often complex functionality. The lamination to protect the conductive posts can cause warpage, leading to defects in later manufacturing processes, e.g., with top surface mount technology.

In addition, there is an increasing demand for high density packages, i.e., less than 300 μm bump pitch. Unfortunately, high density and fine pitch increases the chance for bump shorts. A need exists for high density, low pitch electrical interconnect with high signal transmission speed, but without warpage and electrical shorting issues, prevalent in the prior art, to accommodate the next generation of DSmSiP.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
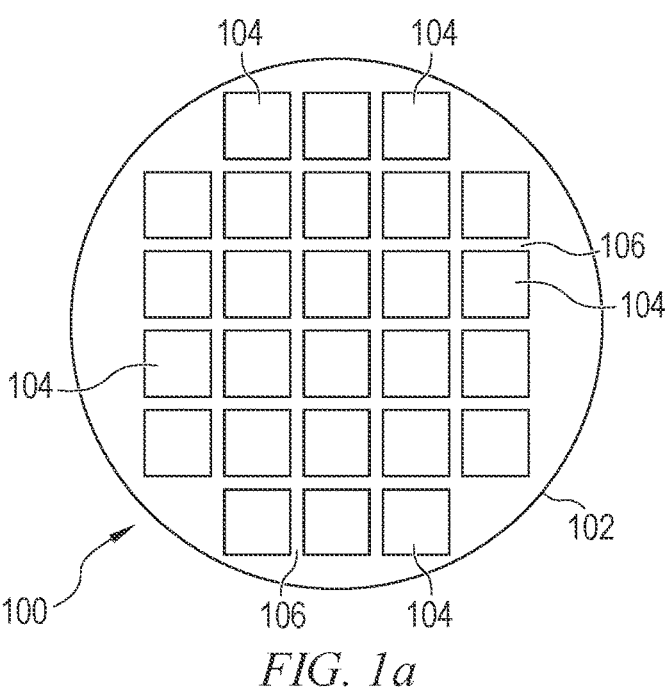
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
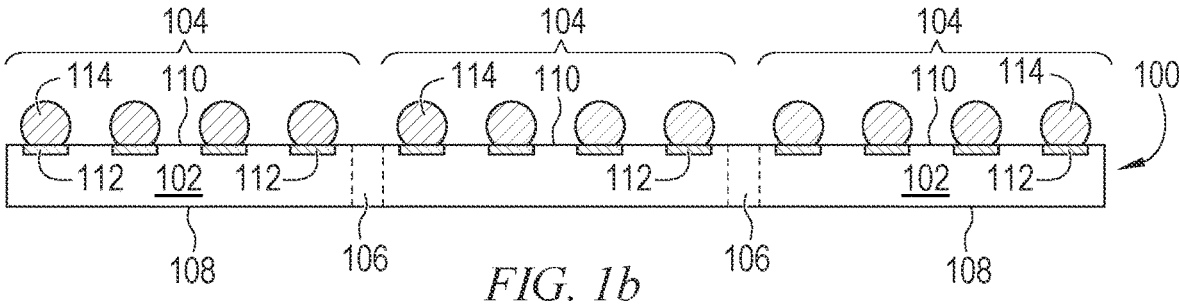

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Lead (Pb), Bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
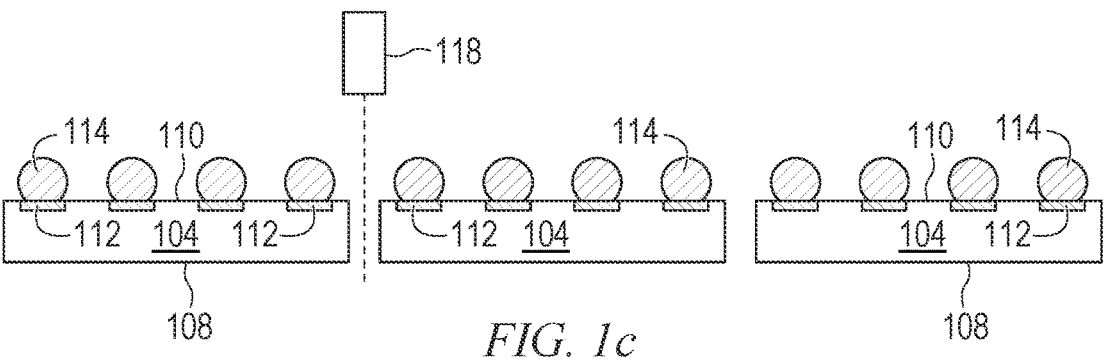

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
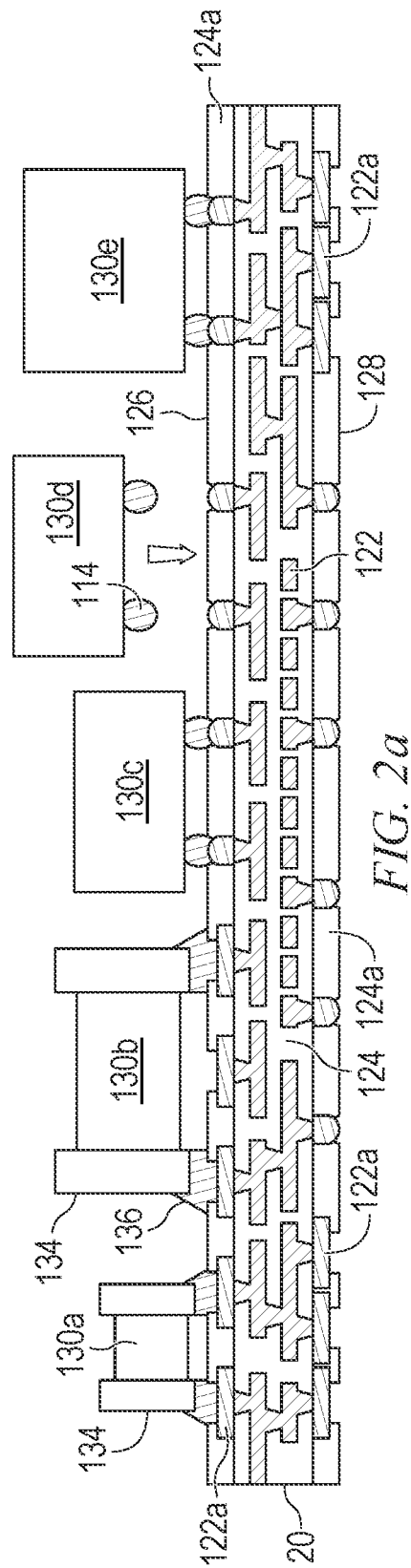
FIGS. 2a-2j illustrate a process of forming a DSmSiP with high-pitched interconnects.

FIGS. 2a-2j illustrate a process of forming a dual-side molded system-in-package (DSmSiP) with high-pitched interconnects. FIG. 2a shows a cross-sectional view of multi-layered interconnect substrate 120 including conductive layers 122 and insulating layers 124. While only a single substrate 120 suitable to form a single semiconductor package is shown, hundreds or thousands of units are commonly manufactured and processed as part of a single substrate 120 before being singulated from each other, using the same steps described herein performed en masse. A separate substrate 120 could also be used for each unit being manufactured, the substrate being singulated before the steps shown in FIGS. 2a-2j and a plurality of individual substrates being placed on a common carrier for processing.

Conductive layer 122 can be one or more layers of Al, Cu, Sn, Ni, Au, Ag, or other suitable electrically conductive material. Conductive layers can be formed using PVD, CVD, electrolytic plating, electroless plating, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layers 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering, or thermal oxidation. Insulating layers 124 provides isolation between conductive layers 122.

Conductive layers 122 are patterned to form contact pads 122a on top and bottom surfaces of substrate 120. Insulating layers 124 are formed as passivation layers 124a over contact pads 122a. Any other suitable type of package substrate or leadframe is used for substrate 120 in other embodiments.

In FIG. 2a, electrical components 130a-130e are disposed on surface 126 of interconnect substrate 120 and electrically and mechanically connected to contact pads 122a. For example, electrical components 130a and 130b can be discrete electrical devices such as a diode, transistor, resistor, capacitor, and inductor. Electrical component 130c, 130d, and 130e can be, or be similar to, semiconductor die 104 from FIG. 1c with bumps 114 oriented toward surface 126 of substrate 120. Alternatively, electrical components 130a-130e can include other semiconductor die, semiconductor packages, surface mount devices, RF components, or discrete electrical devices. Any of the electrical components 130a-130c can have IPDs formed thereon.

Electrical components 130a-130e are positioned over surface 126 of substrate 120 using a pick and place operation. Electrical components 130a-130e are brought into contact with contact pads 122a on surface 126 of substrate 120. Terminals 134 of electrical components 130a and 130b are electrically and mechanically connected to contact pads 122a using solder or conductive paste 136. Electrical components 130c-130e are electrically and mechanically connected to contact pads 122a by reflowing bumps 114.

Figure 2B:
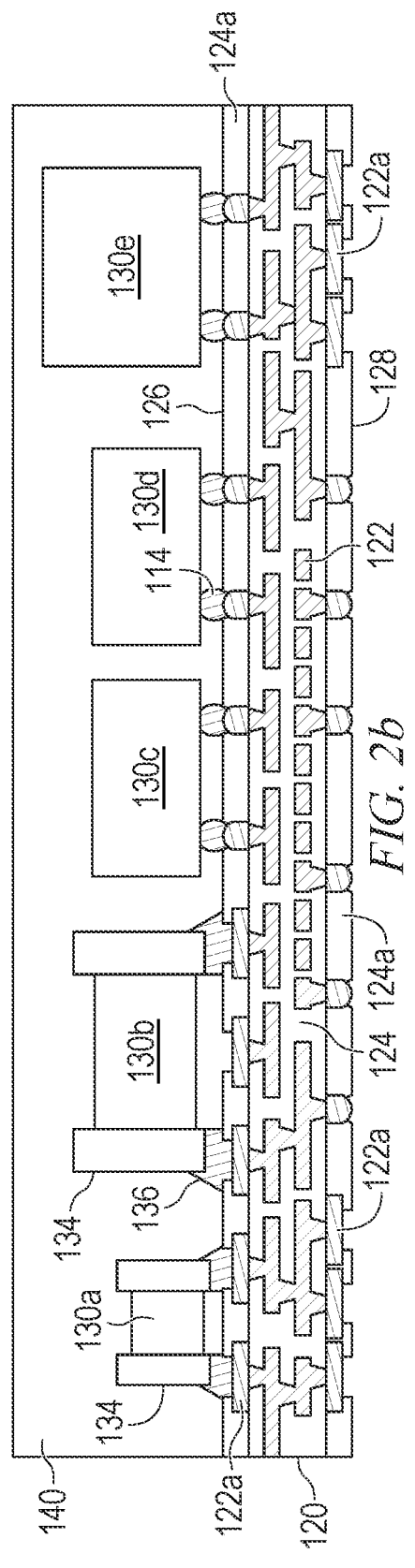

In FIG. 2b, encapsulant or molding compound 140 is deposited over and around electrical components 130a-130e and surface 126 of substrate 120 using a paste printing, compressive molding, transfer molding, liquid encapsulant molding, vacuum lamination, spin coating, or other suitable applicator. Encapsulant 140 can be liquid or granular polymer composite material, such as epoxy resin, epoxy acrylate, or another suitable polymer, with or without a suitable filler. Encapsulant 140 is non-conductive, provides structural support, and environmentally protects the semiconductor device from external elements and contaminants. In some embodiments, top surfaces of one or more components 130a-130e are exposed from encapsulant 140 by using film-assisted molding, backgrinding after molding, or another suitable process.

Figures 2C, 2D:
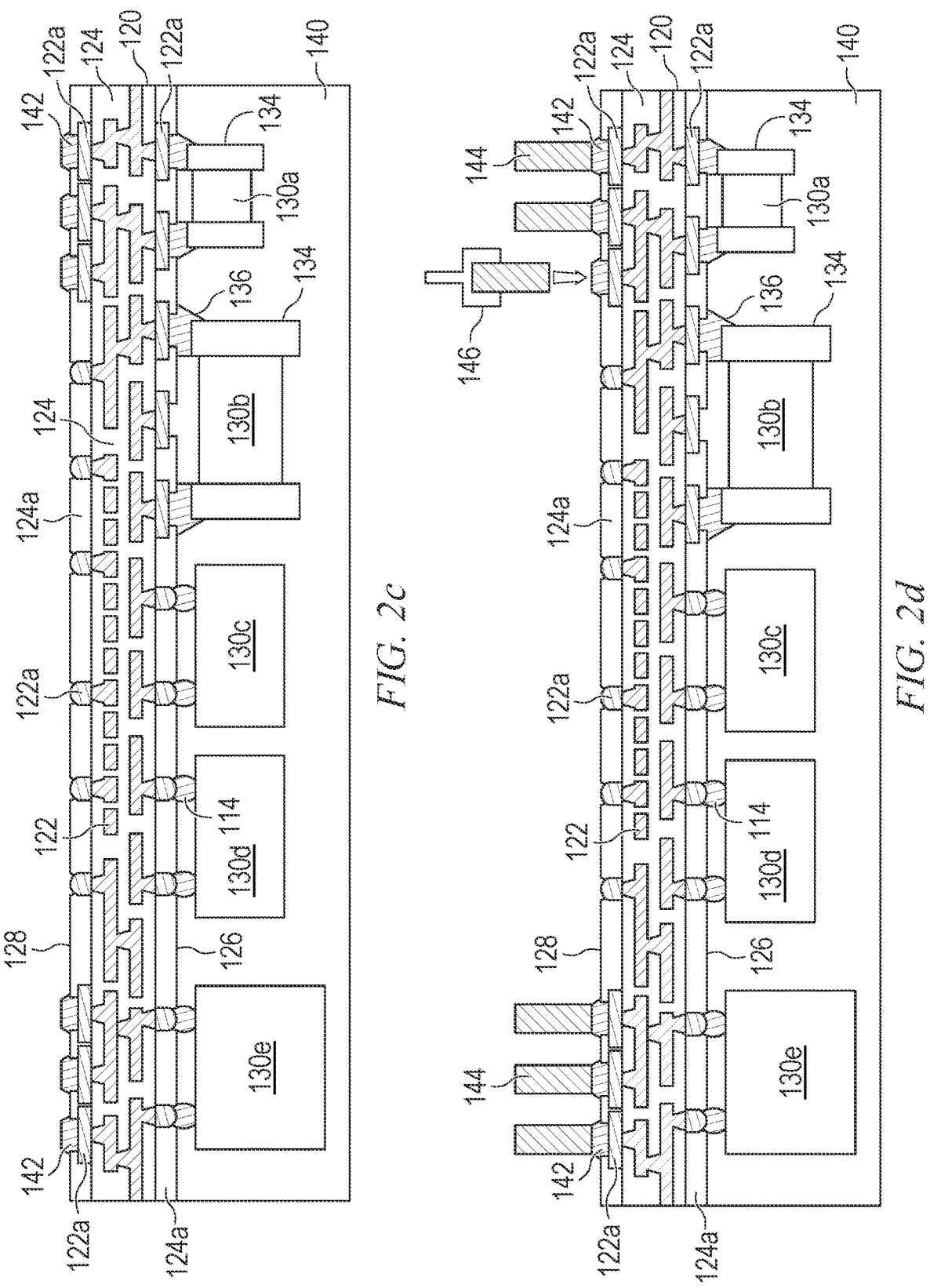

In FIG. 2c, substrate 120 is flipped so that bottom surface 128 is oriented upward. A solder paste 142, solder bump, conductive paste, conductive adhesive, or another conductive material is disposed on select contact pads 122a on which vertical interconnects are intended to be placed. Solder paste 142 can be disposed through a stencil, printed, placed using a ball drop or pick and place operation, or otherwise disposed on the desired contact pads 122a. Solder paste 142 is disposed as described above for bumps 114 on semiconductor die 104 in some embodiments, including optionally being reflowed into bumps or balls.

In FIG. 2d, conductive pillars 144 are disposed over solder paste 142 using a pick and place machine 146. Conductive pillars 144 are formed in a separate operation, e.g., by being cut from a sheet of conductive material or by metal deposition into a mold or mask opening. The conductive material is most commonly copper, but other conductive material such as gold, silver, aluminum, tin, titanium, stainless steel, and combinations or alloys thereof are used in other embodiments. Conductive pillars 144 are cylindrically shaped, with substantially flat top and bottom surfaces and a single side surface that wraps around the entire circumference of the conductive pillar. In other embodiments, conductive pillars 144 are square, rectangular, or another polygonal shape. After being manufactured, conductive pillars 144 are typically disposed into a tape-and-reel storage medium usable by pick and place machine 146.

Pick and place machine 146 picks up a conductive pillar 144 from a tape-and-reel being held by a dispensing mechanism of the pick and place machine. Pick and place machine 146 has an arm that moves each conductive pillar from the tape-and-reel to be placed directly on one of the portions of solder paste 142. In other embodiments, conductive pillars 144 are dipped into a vat of solder paste 142 before disposing the pillars on the substrate to add the conductive paste to the bottom of the pillar, rather than or in addition to placing conductive paste on the substrate first. Solder paste 142 can remain as a paste, liquid, or adhesive to temporarily stick conductive pillar 144 to substrate 120. Once all conductive pillars 144 for a unit or panel of units are placed onto their respective contact pads 122a with solder paste 142, then the solder paste can be reflowed all at once for a more secure physical and electrical connection. In other embodiments, pick and place machine 146 heats up the individual conductive pillars 144 as the pillars are placed so that the underlying solder for each pillar is reflowed when the individual pillar is placed.

Figures 2E, 2F:
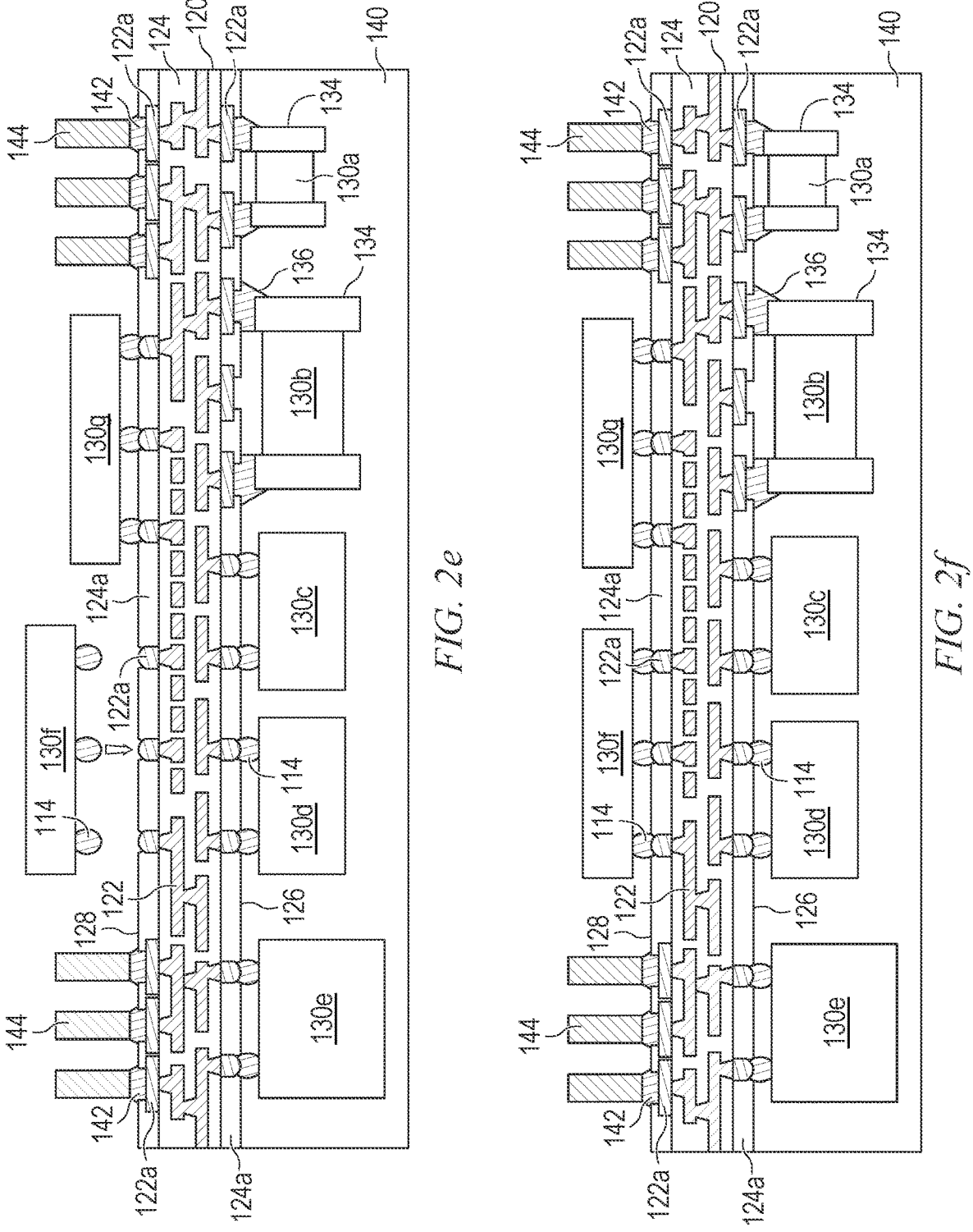

In FIG. 2e, electrical components 130f and 130g are disposed over bottom surface 128 of substrate 120. Electrical components 130f and 130g are semiconductor die, the same as or similar to semiconductor die 104. Any suitable electrical components can be placed on top surface 126 and bottom surface 128 of substrate 120 in any desired combination. Bumps 114 are reflowed to mechanically and electrically connect electrical components 130f and 130g to contact pads 122a of substrate 120. Bumps 114 are reflowed at the same time as solder paste 142 in some embodiments. FIG. 2f shows substrate 120 with conductive pillars 144 and electrical components 130f and 130g mounted.

Figures 2G, 2H:
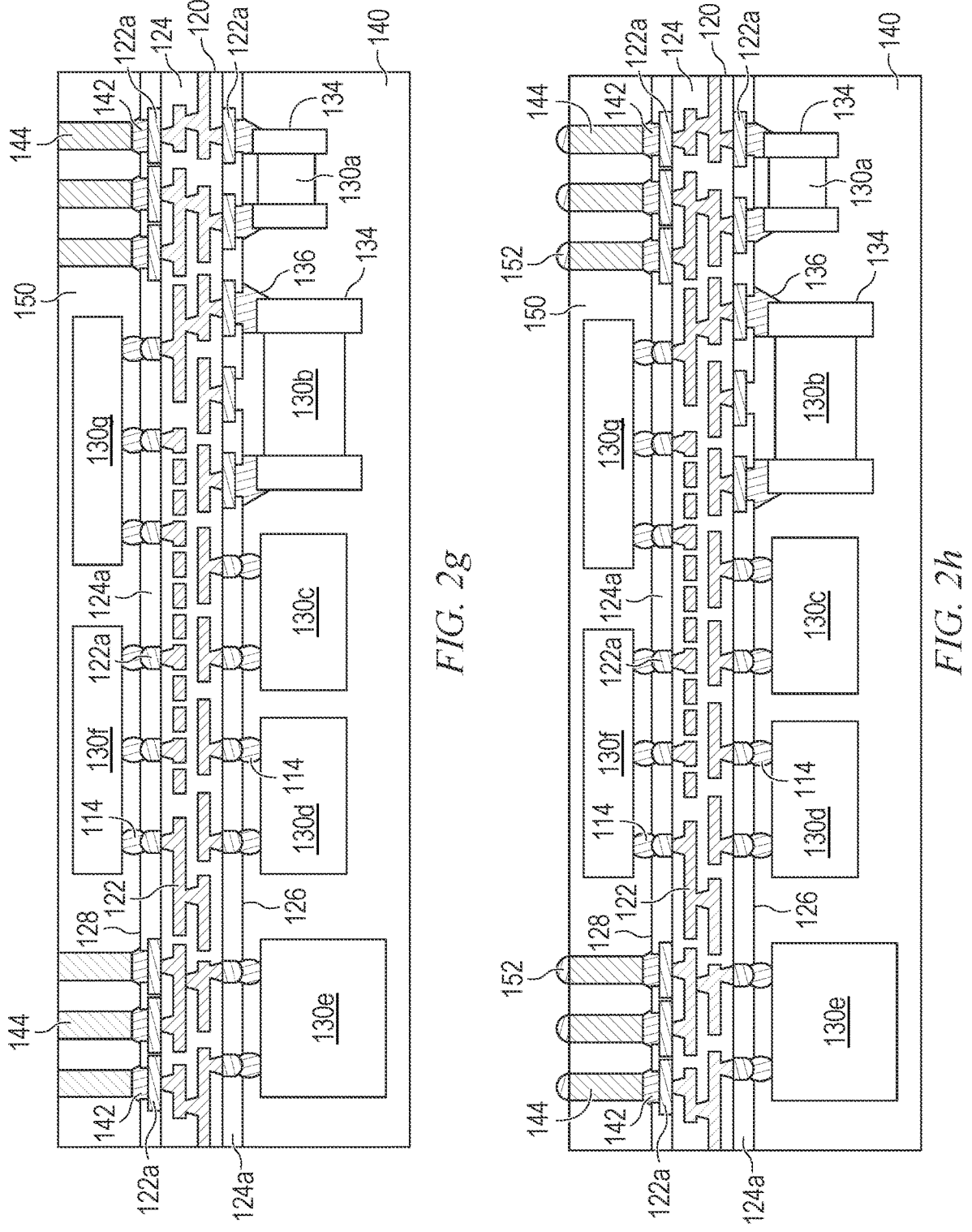

In FIG. 2g, encapsulant or molding compound 150 is deposited over and around electrical components 130f and 130g, conductive pillars 144, and surface 128 of substrate 120 using a paste printing, compressive molding, transfer molding, liquid encapsulant molding, vacuum lamination, spin coating, or another suitable applicator. Encapsulant 150 can be liquid or granular polymer composite material, such as epoxy resin, epoxy acrylate, or another suitable polymer, with or without a suitable filler. Encapsulant 150 is non-conductive, provides structural support, and environmentally protects the semiconductor device from external elements and contaminants.

Encapsulant 150 is deposited with top surfaces of conductive pillars 144 exposed from the encapsulant. Electrical components 120f and 130g are also exposed in some embodiments. Conductive pillars 144 are exposed by depositing encapsulant 150 using film-assisted molding or another molding technique that prevents the conductive pillars from being covered in encapsulant. In other embodiments, conductive pillars 144 are completely over-molded and then exposed by backgrinding encapsulant 150 until the conductive pillars are exposed. Top surfaces of conductive pillars 144 are coplanar to a top surface of encapsulant 150. In some embodiment, additional conductive layers are plated onto conductive pillars 144, either before or after the pillars are disposed on substrate 120 and encapsulated, e.g., an adhesion or solder wetting layer.

In FIG. 2h, an electrically conductive bump material is deposited over exposed surfaces of conductive pillars 144 using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pillars 144 using a suitable attachment or bonding process. In one embodiment, the bump material is reflowed by heating the material above its melting point to form balls or bumps 152. In one embodiment, bump 152 is formed over a UBM having a wetting layer, barrier layer, and adhesion layer. Bump 152 can also be compression bonded or thermocompression bonded to conductive pillar 144. Bump 144 represents one type of interconnect structure that can be formed over conductive pillar 144. The interconnect structure can also use bond wires, conductive paste, stud bump, micro bump, or other electrical interconnect.

Figures 2I, 2J:
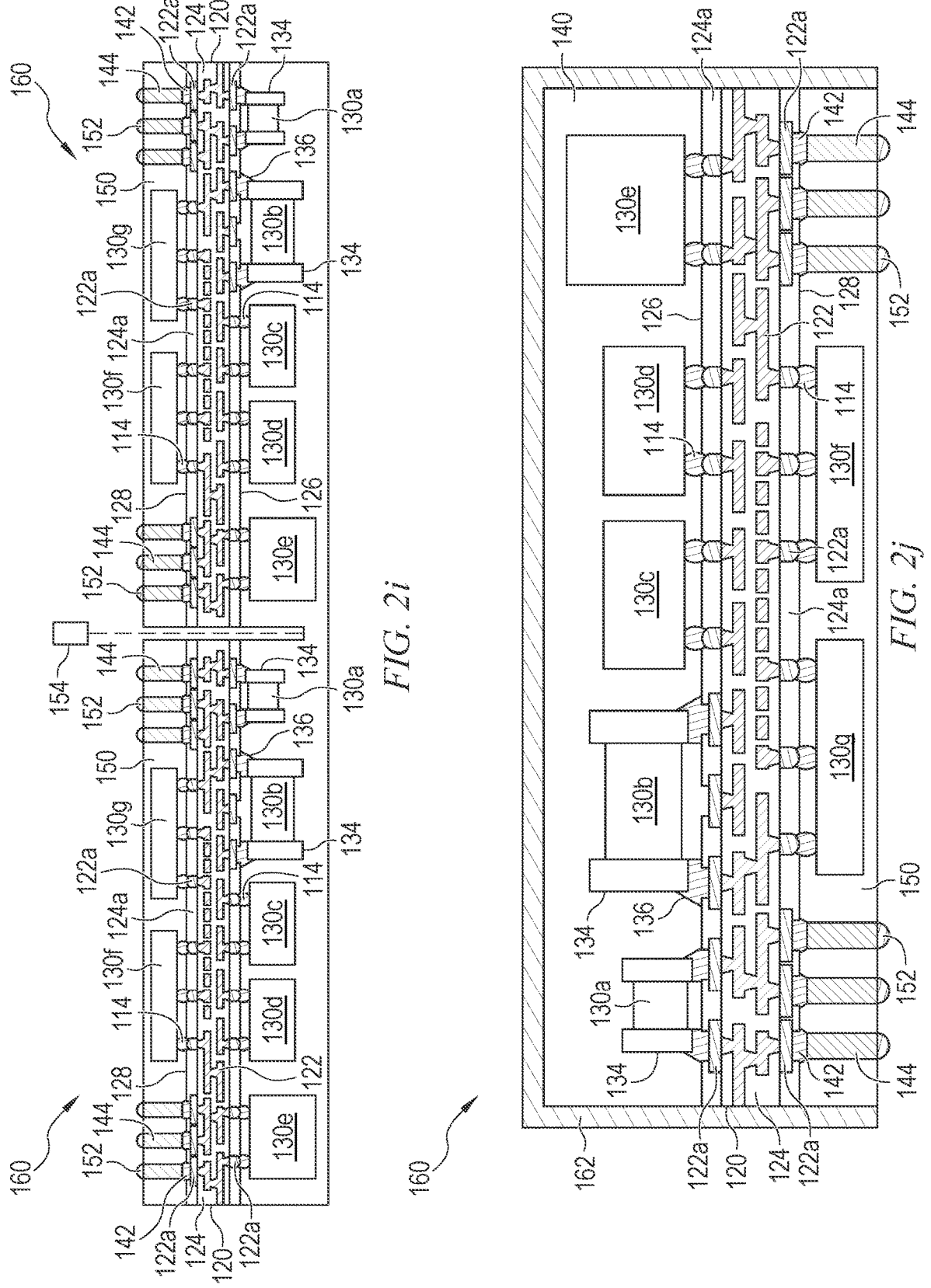

FIG. 2i shows a panel of devices having been formed together on a larger substrate 120. Only two semiconductor packages 160 are shown, but many more packages are commonly formed at once, e.g., tens, hundreds, or thousands of packages on a single substrate 120. Packages 160 are singulated from each other by using a saw, laser cutter 154, or other suitable tool to cut through encapsulant 140, substrate 120, and encapsulant 150. Cutting results in side surfaces of substrate 120, encapsulant 140, and encapsulant 150 that are all coplanar to each other.

Packages 160 are flipped in FIG. 2j so that encapsulant 140 is oriented at the top of the packages. Packages 160 are flipped prior to singulation in other embodiments. To address electromagnetic interference (EMI), radio frequency interference (RFI), harmonic distortion, and other interdevice interference, a shielding layer 162 is optionally formed over a top surface of encapsulant 140. Shielding layer 162 is deposited, printed, sputtered, plated, or otherwise formed. Plating can be performed by CVD, PVD, other sputtering methods, electroplating, electroless plating, or another suitable metal deposition process. Shielding layer 162 includes one or more layers of Al, Cu, Sn, Ni, Au, Ag, stainless steel, or other suitable electrically conductive material.

Singulating through encapsulant 140, substrate 120, and encapsulant 150 to form individual semiconductor packages 160 prior to forming shielding layer 162 allows the shielding layer to be formed down side surfaces of the packages. Shielding layer 162 extending down side surfaces of semiconductor packages 160 helps to protect from laterally incident EMI. Portions of conductive layer 122 are exposed at side surfaces of substrate 120 in some embodiments to physically and electrically connect to shielding layer 162, thereby grounding the shielding layer to improve performance.

Semiconductor package 160 in FIG. 2j is a completed package ready to be incorporated into a larger electronic device or stored in a tape-and-reel for delivery to another manufacturer. Semiconductor package 160 is a DSmSiP with a fine-pitched interconnect. Utilizing conductive pillars 144 allows smaller bumps 152 relative to using only solder bumps as the interconnect structure. Smaller bumps 152 allow a finer pitch of interconnect with a lower risk that the bumps will reflow together inadvertently. The finer-pitched interconnect also increases the speed of signal transmission. Picking and placing conductive pillars 144 over solder paste 142 is a simpler and more cost-effective process compared to the prior art.

Figure 3B:
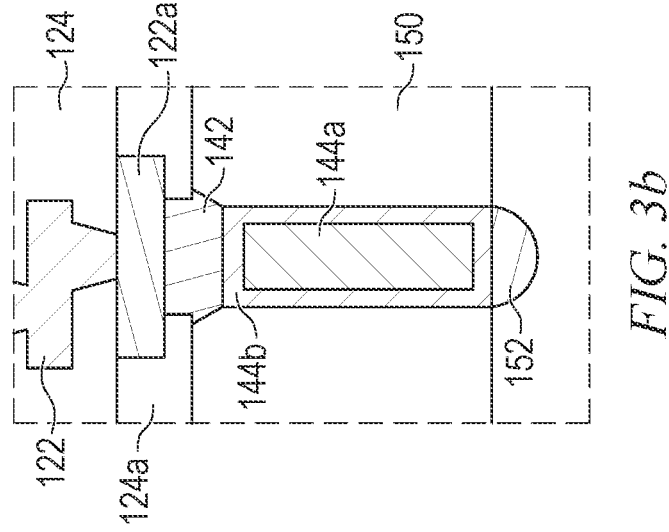
FIGS. 3a-3d illustrate additional conductive post options for the DSmSiP.
Figure 3A:
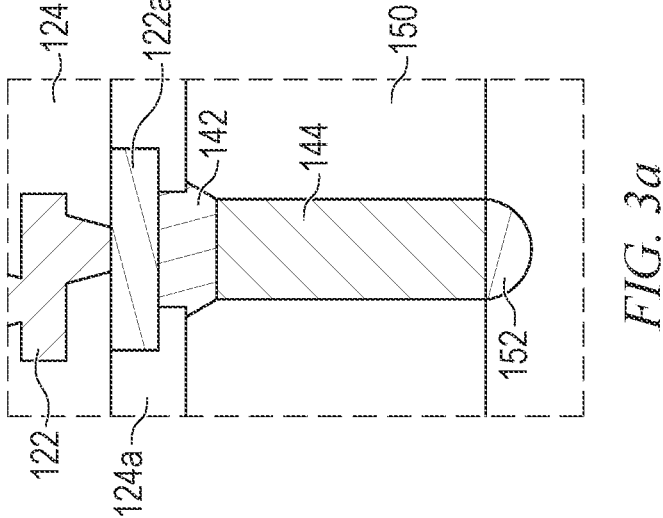

FIGS. 3a-3d illustrate options for conductive pillars 144. FIG. 3a is a detailed view of a conductive pillar 144 from FIG. 2j. Conductive pillar 144 is a solid mass of copper without additional coatings or layers. Solder paste 142, having been reflowed and hardened into simply solder, connects conductive pillar 144 to contact pad 122*a*. Encapsulant 150 has an external surface coplanar to an external surface of conductive pillar 144. Solder bump 152 is formed on the external surface of conductive pillar 144. Solder bump 152 is relatively small, with its size limited by the footprint of conductive pillar 144. Conductive pillar 144 allows bump 152 to be vertically offset from substrate 120 without a corresponding lateral size growth that would occur with a conductive bump extending from substrate 122 to the height of encapsulant 150.

FIG. 3*b* shows another embodiment with a core conductive pillar 144*a* and a coating 144*b* formed over the core. In one embodiment, core conductive pillar 144*a* is the same as conductive pillar 144 above, e.g., a solid copper pillar or post. Coating 144*b* is another material to improve solder reflow or adhesion, reduce electrical resistance to aid in signal propagation, or improve another relevant quality of the conductive pillars. In one embodiment, coating 144*b* is silver. Coating 144*b* is sputtered, plated, or deposited onto pillar 144*a* during manufacture of the pillars. In other embodiments, coating 144*b* is formed only on the external surface of pillars 144 after deposition of encapsulant 150. Coating 144*b* can be one or more conductive layers.

Figure 3D:
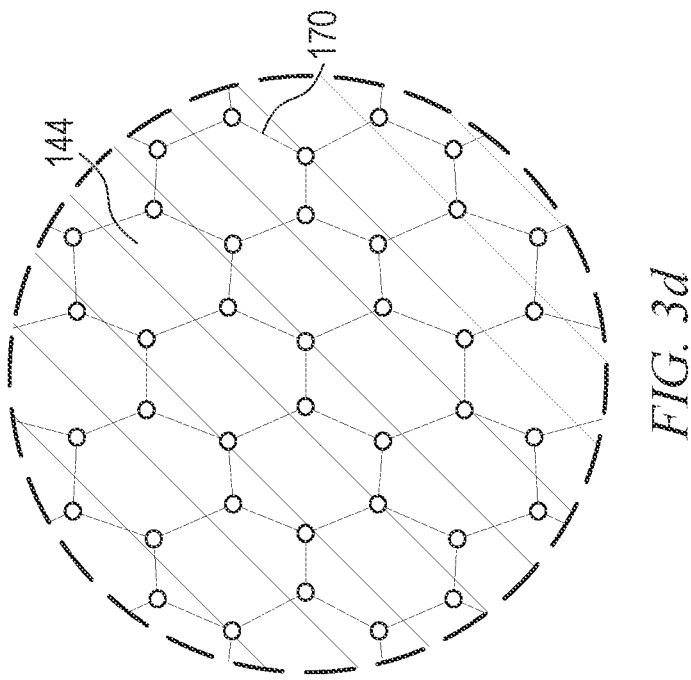
Figure 3C:
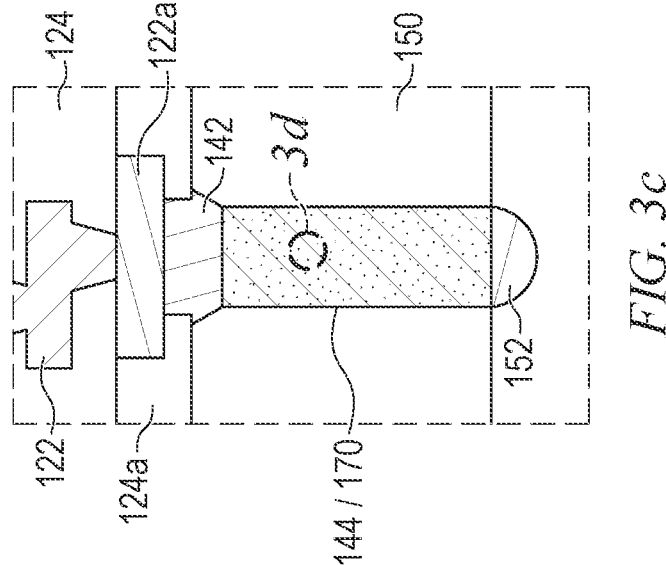

FIG. 3*c* shows conductive pillar 144 with a graphene coating 170. Graphene coating 170 forms a shell around pillar 144. Graphene coating 170 is an allotrope of carbon with one or more layers of carbon atoms each arranged in a two-dimensional (2D) honeycomb lattice. FIG. 3*d* illustrates a magnified view of pillar 144 showing the lattice structure of graphene coating 170. Graphene coating 170 can be formed by CVD, wet chemical synthesis, or other suitable means. One or more conductive layer coatings 144*b* can also be formed under graphene coating 170. A plurality of graphene coatings 170 is formed on each conductive pillar 144 in some embodiments.

For CVD, pillar 144 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 170 on pillar 144. The release of carbon atoms over pillar 144 forms a continuous sheet of graphene coating 170. Additional information related to forming graphene coating is disclosed in U.S. Pat. Nos. 8,535,553, 10,421,123, Korean Patent No. KR101465616, and Korean Patent No. KR101895114, which are all incorporated herein by reference.

The properties of graphene are summarized in Table 1:

TABLE 1

| Properties of graphene Parameter | |
| --- | --- |
| Electronic mobility | $2 \times 10^5$ cm$^2$/Vs |
| Current density | $10^9$ A/cm |
| Velocity of fermion (electron) | $10^6$ m/s |
| Thermal conductivity | 4000-5000 W/mK |
| Tensile strength | 1.5 TPa |
| Breaking strength | 42 N/m |
| Transparency | 97.7% |
| Elastic limit | 20% |
| Specific surface area | 2360 m$^2$/g |

Table 2 compares graphene against silver or copper as alternatives:

TABLE 2

| Graphene Compared to Silver and Copper | | | |
| --- | --- | --- | --- |
| Material | Graphene | Silver | Copper |
| $\rho(\Omega \cdot m)$ at 20° C. | $1.00 \times 10^{-8}$ | $1.59 \times 10^{-8}$ | $1.68 \times 10^{-8}$ |
| $\sigma(S/m)$ at 20° C. | $1.00 \times 10^8$ | $6.40 \times 10^7$ | $5.96 \times 10^7$ |
| Temperature Coefficient (K$^{-1}$) | −0.0002 | 0.0038 | 0.003862 |
| Density (g/cm$^3$) | 1.5-2.0 | 10.49 | 8.96 |

Conductive pillars 144 with graphene coating 170 have 100-times the electrical conductivity of Cu alone, and a hardness 200 times harder than steel. Graphene coating 170 reduces or eliminates oxidation of pillar 144. Graphene coating 170 with a Cu pillar 144 is low cost. Graphene coating 170 has a low moisture permeability and a high thermal conductivity of 4000-5000 W/mK, 10 times higher than Cu at room temperature. Since carbon also has a good solderability and wettability of solder paste, graphene-coated pillars 144 can be readily incorporated into existing semiconductor package topologies. Graphene coating 170 exhibits a high degree of flexibility and remains stable against warpage. Graphene-coated pillars 144 improve electrical conductivity while lowering manufacturing cost.

Figure 4A:
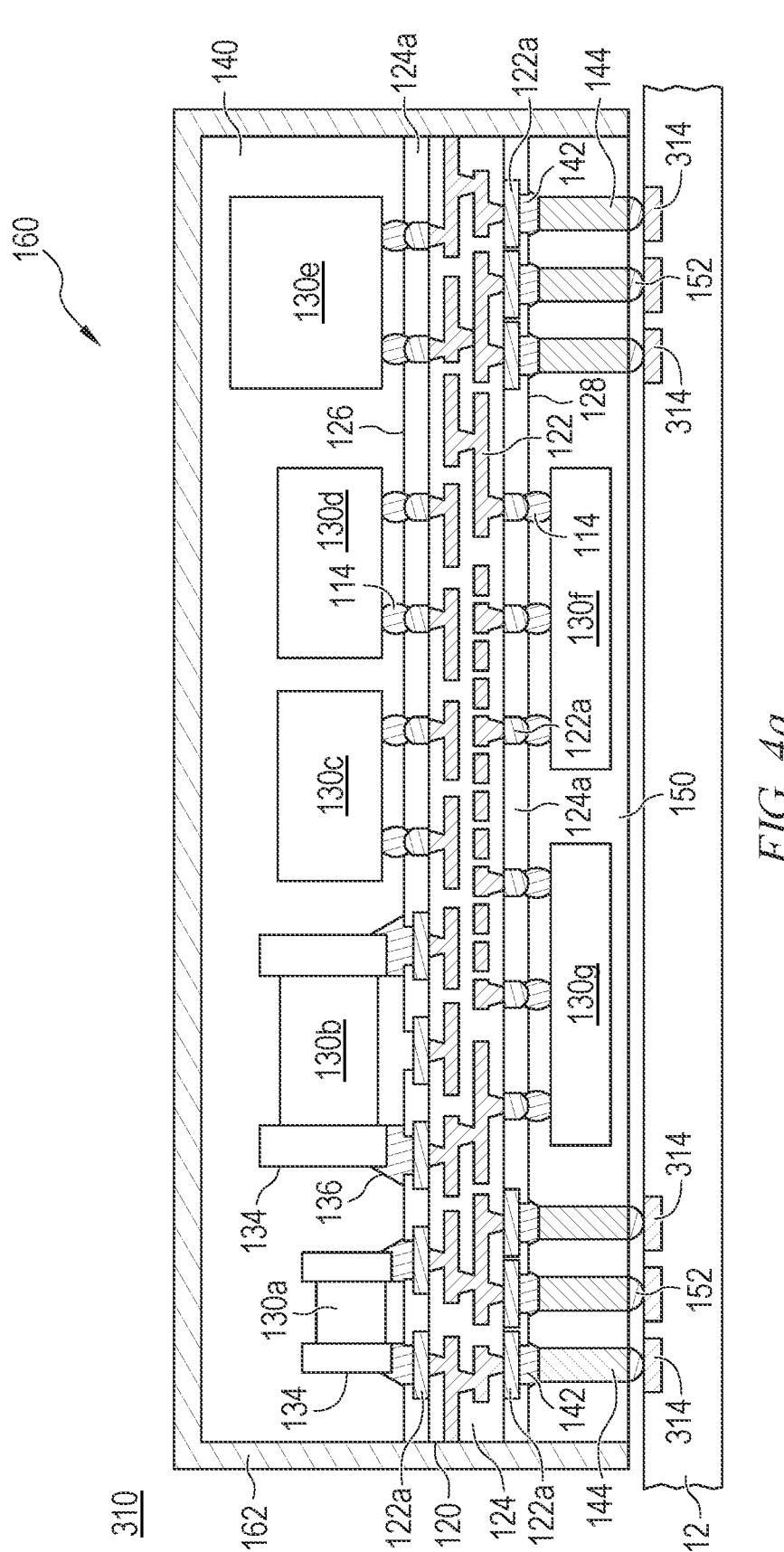
FIGS. 4a and 4b illustrate a printed circuit board (PCB) with different types of packages disposed on a surface of the PCB along with the DSmSiP.
Figure 4B:
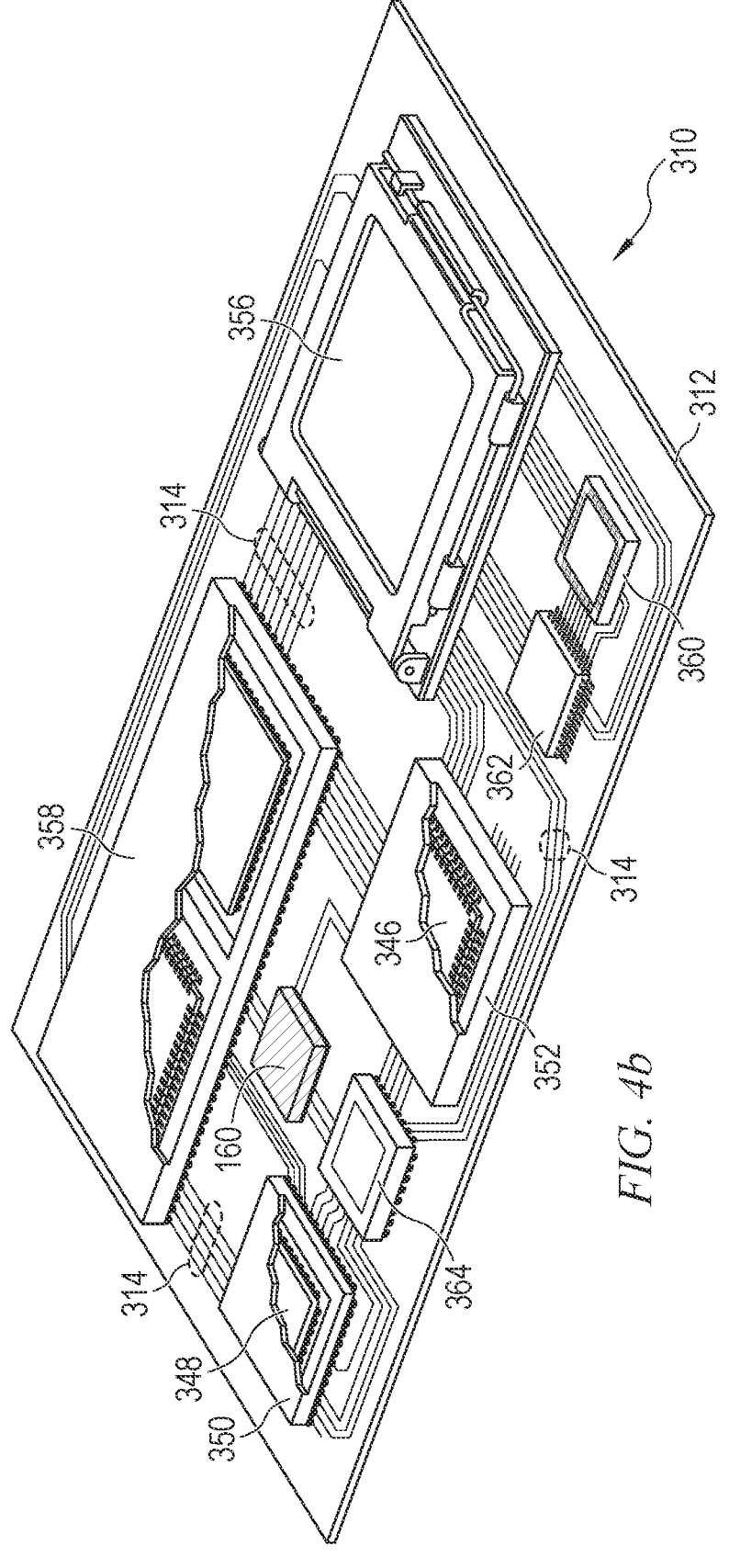

FIGS. 4*a* and 4*b* illustrate integrating the above-described semiconductor packages and devices, e.g., semiconductor package 160, into a larger electronic device 310. FIG. 4*a* illustrates a partial cross-section of semiconductor package 160 mounted onto a printed circuit board (PCB) or other substrate 312 as part of electronic device 310. Bumps 152 are reflowed onto conductive layer 314 of PCB 312 to physically attach and electrically connect semiconductor package 160 to the PCB. In other embodiments, thermocompression or other suitable attachment and connection methods are used. In some embodiments, an adhesive or underfill layer is used between semiconductor package 160 and PCB 312. Electrical components 130*a*-130*i* are electrically coupled to conductive layer 314 through bumps 152, pillars 144, solder paste 142, and substrate 120.

FIG. 4*b* illustrates electronic device 310 having a chip carrier substrate or PCB 312 with a plurality of semiconductor packages disposed on a surface of PCB 312, including semiconductor package 160. Electronic device 310 can have one type of semiconductor package, or multiple types of semiconductor packages, depending on the application.

Electronic device 310 can be a stand-alone system that uses the semiconductor packages to perform one or more electrical functions. Alternatively, electronic device 310 can be a subcomponent of a larger system. For example, electronic device 310 can be part of a tablet, cellular phone, digital camera, communication system, or other electronic device. Alternatively, electronic device 310 can be a graphics card, network interface card, or other signal processing card that can be inserted into a computer. The semiconductor package can include microprocessors, memories, ASICs, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 312 may have a more irregular shape to fit conveniently into more ergonomic and smaller device shells.

In FIG. 4*b*, PCB 312 provides a general substrate for structural support and electrical interconnect of the semiconductor packages disposed on the PCB. Conductive signal traces 314 are formed over a surface or within layers of PCB 312 using evaporation, electrolytic plating, electroless plating, screen printing, or other suitable metal deposition process. Signal traces 314 provide for electrical communication between each of the semiconductor packages, mounted components, and other external system components. Traces 314 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 346 and flipchip 348, are shown on PCB 312. Additionally, several types of second level packaging, including ball grid array (BGA) 350, bump chip carrier (BCC) 352, land grid array (LGA) 356, multi-chip module (MCM) or SIP module 358, quad flat non-leaded package (QFN) 360, quad flat package 362, and embedded wafer level ball grid array (eWLB) 364 are shown disposed on PCB 312. In one embodiment, eWLB 364 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 312. In some embodiments, electronic device 310 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims. The order of steps as illustrated and described above is not critical to the invention unless explicitly claimed as being performed in a specific order, described above as being critically performed in a specific order, or where one step clearly depends on another step being performed first from a technical standpoint.

What is claimed:

1. A semiconductor device, comprising:
a substrate;
an electrical component mounted to a first surface of the substrate;
a conductive pillar disposed over the first surface of the substrate within a height of the electrical component;
a conductive layer formed on a top surface and a side surface of the conductive pillar;
a solder, solder paste, or conductive paste disposed between and physically contacting the conductive pillar and substrate;
an encapsulant deposited over the substrate, electrical component, and conductive pillar, wherein the conductive pillar is embedded in the encapsulant with an end of the conductive pillar exposed from the encapsulant; and
a solder bump formed over the conductive pillar outside the encapsulant.

2. The semiconductor device of claim 1, further including a second encapsulant deposited over a second surface of the substrate.

3. The semiconductor device of claim 2, further including a shielding layer formed over the second encapsulant.

4. The semiconductor device of claim 2, further including a second electrical component disposed over the second surface of the substrate within the second encapsulant.

5. A semiconductor device, comprising:
a substrate;
a conductive pillar disposed over a first surface of the substrate;
a solder, solder paste, or conductive paste disposed between and physically contacting the conductive pillar and substrate;
an encapsulant deposited around the conductive pillar, wherein the conductive pillar extends through the encapsulant; and
a solder bump formed over the conductive pillar outside the encapsulant.

6. The semiconductor device of claim 5, further including a graphene coating formed over the conductive pillar.

7. The semiconductor device of claim 5, further including a conductive layer formed on a top surface and a side surface of the conductive pillar.

8. The semiconductor device of claim 5, further including a second encapsulant deposited over the substrate opposite the conductive pillar.

9. The semiconductor device of claim 8, further including a shielding layer formed over the second encapsulant.

10. The semiconductor device of claim 8, further including a second electrical component disposed over the second surface of the substrate within the second encapsulant.

11. A method of making a semiconductor device, comprising:
providing a substrate;
disposing an electrical component over a first surface of the substrate;
disposing a solder paste over the first surface of the substrate;
disposing a conductive pillar on the solder paste;
depositing an encapsulant over the first surface of the substrate, the electrical component, and the conductive pillar, wherein the encapsulant extends around the conductive pillar; and
forming a solder bump over the conductive pillar.

12. The method of claim 11, further including forming a graphene coating over the conductive pillar.

13. The method of claim 11, further including forming a conductive layer over the conductive pillar.

14. The method of claim 13, further including forming a graphene coating over the conductive layer.

15. The method of claim 11, further including depositing a second encapsulant over a second surface of the substrate.

16. The method of claim 15, further including forming a shielding layer over the second encapsulant.

17. The method of claim 15, further including disposing a second electrical component over the second surface of the substrate prior to depositing the second encapsulant.

18. A method of making a semiconductor device, comprising:
providing a substrate;

disposing a conductive paste over a first surface of the substrate;

forming a conductive pillar;

disposing the conductive pillar over the conductive paste after forming the conductive pillar, wherein the conductive pillar is disposed as an isolated conductive pillar devoid of insulating material attached to the conductive pillar; and forming a solder bump over the conductive pillar.

19. The method of claim 18, further including forming a graphene coating over the conductive pillar.

20. The method of claim 18, further including forming a conductive layer over the conductive pillar.

21. The method of claim 18, further including:

depositing a first encapsulant over the first surface of the substrate; and depositing a second encapsulant over a second surface of the substrate.

22. The method of claim 21, further including forming a shielding layer over the second encapsulant.

23. The method of claim 21, further including disposing a second electrical component over the second surface of the substrate prior to depositing the second encapsulant.

* * * * *